(12) United States Patent
Yeh et al.

(10) Patent No.: US 8,581,347 B2
(45) Date of Patent: Nov. 12, 2013

(54) FORMING BIPOLAR TRANSISTOR THROUGH FAST EPI-GROWTH ON POLYSILICON

(75) Inventors: Der-Chyang Yeh, Hsin-Chu (TW); Li-Weng Chang, Taipei County (TW); Hua-Chou Tseng, Hsin-Chu (TW); Chih-Ping Chao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 121 days.

(21) Appl. No.: 12/841,275

(22) Filed: Jul. 22, 2010

(65) Prior Publication Data

US 2012/0018811 A1    Jan. 26, 2012

(51) Int. Cl.
*H01L 29/66*    (2006.01)

(52) U.S. Cl.
USPC .................................. 257/378; 257/E21.696

(58) Field of Classification Search
USPC ............. 257/3, 378, 574, 592, 569, 576, 257/E27.015, E21.696; 438/234, 325, 326, 438/327, 336, 341, 350
See application file for complete search history.

(56) References Cited

U.S. PATENT DOCUMENTS

| | | | | |
|---|---|---|---|---|
| 5,015,594 A | * | 5/1991 | Chu et al. | 438/207 |
| 6,133,084 A | * | 10/2000 | Chang et al. | 438/238 |
| 6,222,250 B1 | * | 4/2001 | Gomi | 257/574 |
| 6,777,302 B1 | * | 8/2004 | Chen et al. | 438/335 |
| 2007/0134854 A1 | * | 6/2007 | Zhang et al. | 438/142 |
| 2009/0173928 A1 | * | 7/2009 | Rajendran et al. | 257/3 |

* cited by examiner

*Primary Examiner* — Vongsavanh Sengdara
(74) *Attorney, Agent, or Firm* — Haynes and Boone, LLP

(57) ABSTRACT

Provided is a semiconductor device that includes a first transistor and a second transistor that are formed on the same substrate. The first transistor includes a first collector, a first base, and a first emitter. The first collector includes a first doped well disposed in the substrate. The first base includes a first doped layer disposed above the substrate and over the first doped well. The first emitter includes a doped element disposed over a portion of the first doped layer. The second transistor includes a second collector, a second base, and a second emitter. The second collector includes a doped portion of the substrate. The second base includes a second doped well disposed in the substrate and over the doped portion of the substrate. The second emitter includes a second doped layer disposed above the substrate and over the second doped well.

12 Claims, 11 Drawing Sheets

FORMING BIPOLAR TRANSISTOR THROUGH FAST EPI-GROWTH ON POLYSILICON

BACKGROUND

The semiconductor integrated circuit (IC) industry has experienced rapid growth. Technological advances in IC materials and design have produced generations of ICs where each generation has smaller and more complex circuits than the previous generation. These ICs include bipolar transistor devices. Bipolar transistor devices include NPN-type transistors and PNP-type transistors. As fabrication processes progress to technology nodes that are becoming increasingly small, it may be difficult to form an NPN-type transistor and a PNP-type transistor simultaneously. Often times, simultaneous formation of NPN-type and PNP-type transistors may require additional masks and/or separate process flows, both of which increase fabrication costs and slow down production.

Therefore, while existing methods of fabricating bipolar transistor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
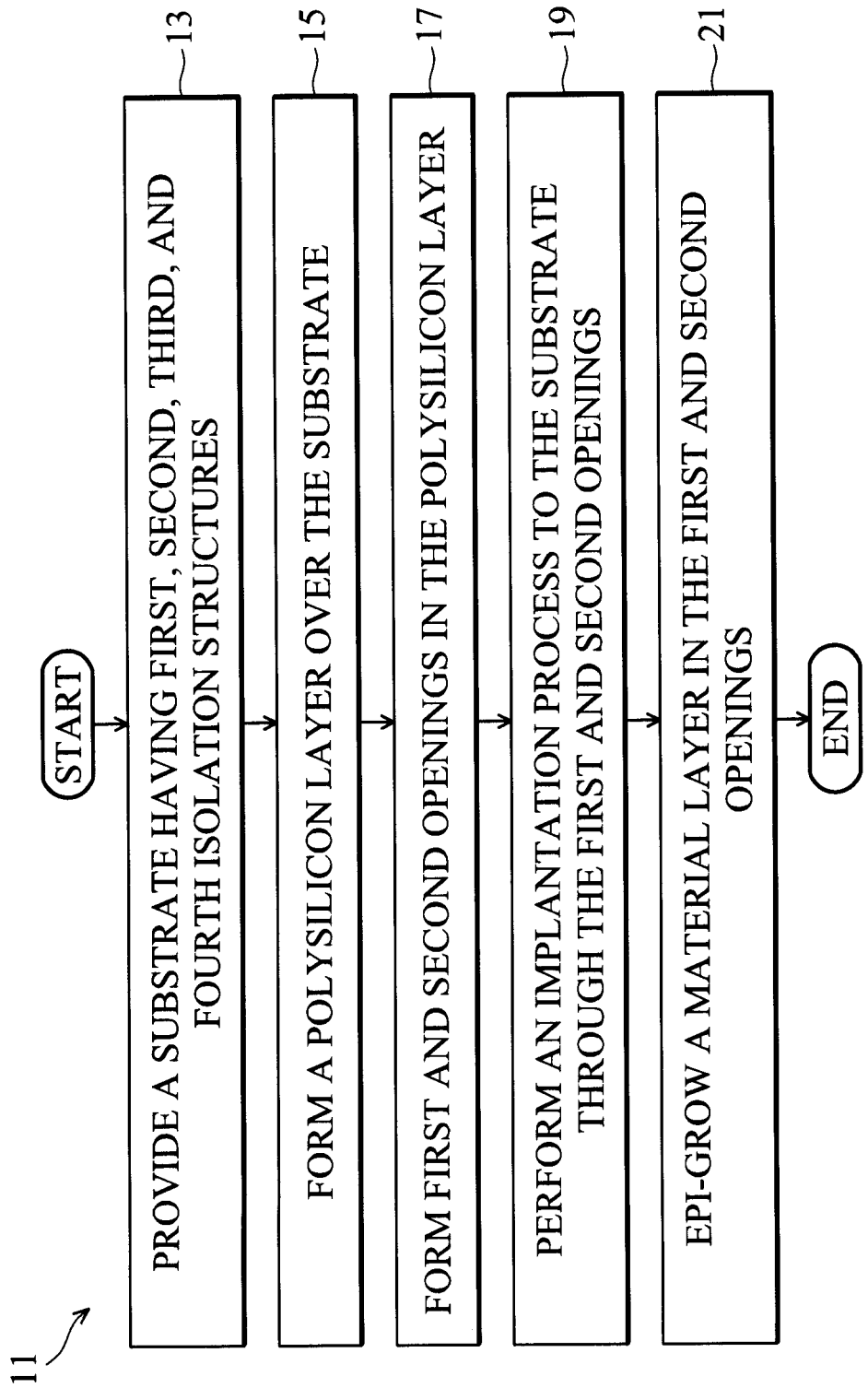
FIG. 1 is a flowchart illustrating a method for fabricating bipolar transistor devices according to various aspects of the present disclosure.

Illustrated in FIG. 1 is a flowchart of a method 11 for fabricating bipolar transistor devices according to various aspects of the present disclosure. Referring to FIG. 1, the method 11 begins with block 13 in which a substrate is provided. First, second, third and fourth isolation structures are formed in the substrate. The method 11 continues with block 15 in which a polysilicon layer is formed over the substrate. The method 11 continues with block 17 in which first and second openings are formed in the polysilicon layer. The first opening exposes a first region of the substrate that is between the first and second isolation structures. The second opening exposes a second region of the substrate that is between the third and fourth isolation structures. The first opening is wider than the second opening. The method 11 continues with block 19 in which an implantation process is performed to the substrate through the first and second openings to form a first doped region in the first region of the substrate and a second doped region in the second region of the substrate. The method 11 continues with block 21 in which a material layer is epi-grown over the substrate. A first portion of the material layer is epi-grown in the first opening and forms a first P/N junction with the first doped region. A second portion of the material layer is epi-grown in the second opening and forms a second P/N junction with the second doped region. The epi-growing is carried out in a manner so that the second portion of the material layer substantially fills the second opening.

FIGS. 2 to 11 are diagrammatic fragmentary cross-sectional side views of a portion of two example bipolar transistor devices formed on the same wafer as a Field-Effect-Transistor (FET) device at various fabrication stages according to embodiments of the method 11 of FIG. 1. It is understood that FIGS. 2 to 11 have been simplified for a better understanding of the inventive concepts of the present disclosure.

Figure 2:
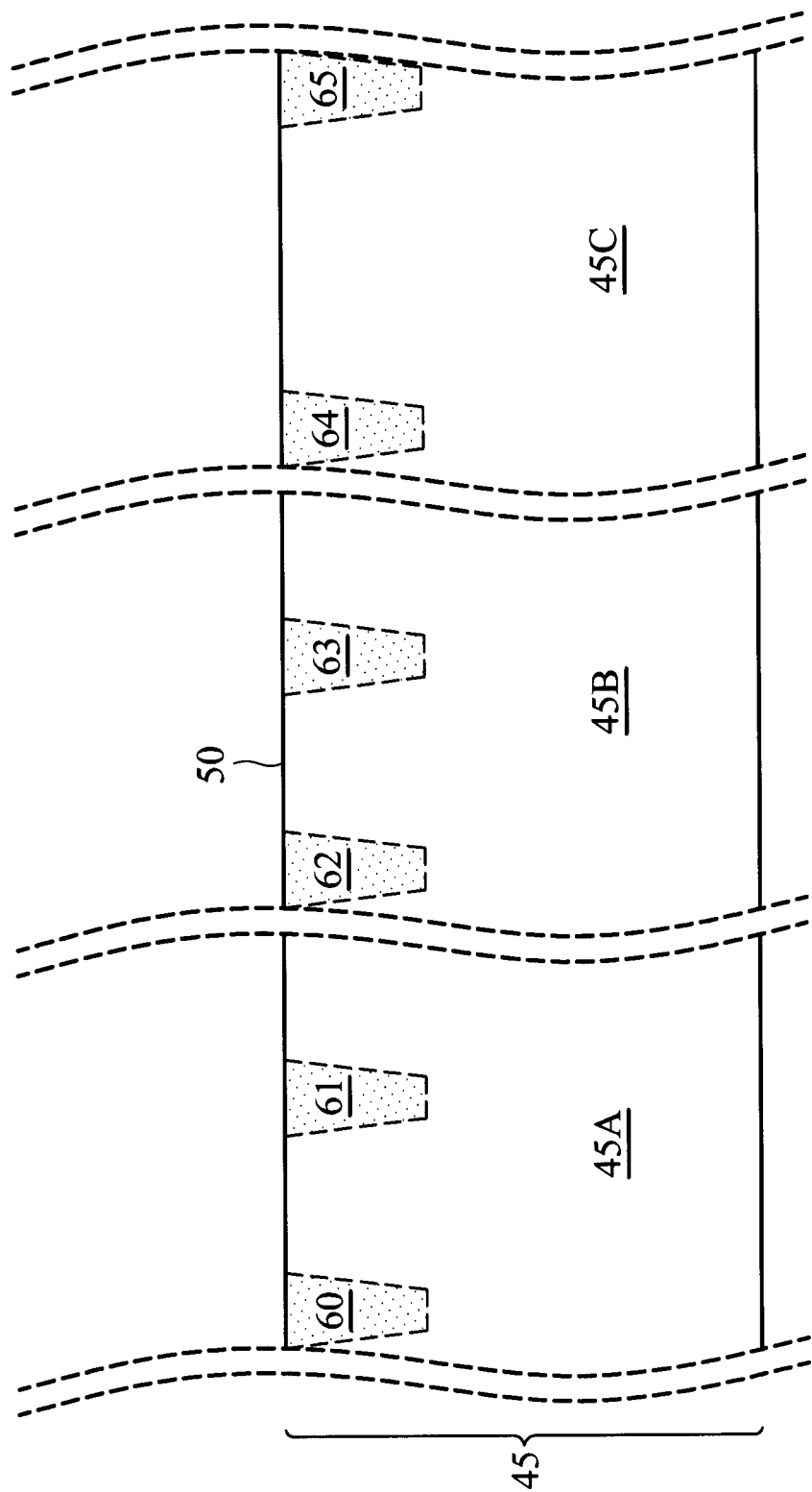
FIGS. 2-11 are diagrammatic fragmentary cross-sectional side views of two example bipolar transistor devices formed on the same wafer with a Field-Effect-Transistor (FET) device at various stages of fabrication in accordance with embodiments of the method illustrated in FIG. 1.

Referring to FIG. 2, a substrate 45 is provided. The substrate 45 is a silicon substrate doped with either a P-type dopant such as boron (a P-type substrate) or an N-type dopant such as phosphorous or arsenic (an N-type substrate). Alternatively, the substrate 45 could be another suitable semiconductor material. In addition, the substrate 45 could include an epitaxial layer (epi layer), may be strained for performance enhancement, and may include a silicon-on-insulator (SOI) structure.

The substrate 45 has substrate portions 45A, 45B, and 45C. The boundaries between the substrate portions 45A-45C are shown as curved dashed lines. The substrate portion 45A is a region of the substrate where an NPN-type bipolar device (or bipolar transistor or BJT) will be formed. The substrate portion 45B is a region of the substrate where a PNP-type bipolar device will be formed. The substrate portion 45C is a region of the substrate where a FET device will be formed. An NPN-type bipolar transistor includes an N-type emitter, an N-Type collector, and a P-type base. A PNP-type bipolar transistor includes a P-type emitter, a P-Type collector, and an N-type base. It is understood that in alternative embodiments, a PNP-type bipolar transistor may be formed in the substrate portion 45A, and an NPN-type bipolar transistor may be formed in the substrate 45B.

The substrate 45 also has a front surface 50. In later fabrication processes, other semiconductor components and elements will be formed over the front surface 50. The front surface 50 may also be referred to as an interface 50.

Isolation structures 60-61 are formed in the substrate portion 45A, isolation structures 62-63 are formed in the substrate portion 45B, and isolation structures 64-65 are formed in the substrate portion 45C. In an embodiment, the isolation structures 60-65 are shallow trench isolation (STI) structures that each include a dielectric material, which may be silicon oxide or silicon nitride. These STI structures may be formed by etching regions of the substrate 45 from the front surface 50 to form openings, and thereafter filling the openings with the dielectric material. Although not illustrated for the sake of simplicity, each of the isolation structures 60-65 is coated with a thermal oxide liner. At this stage of fabrication, this thermal oxide liner also covers portions of the front surface 50 between the isolation structures 60-65, for example between the isolation structures 60 and 61.

Figure 3:
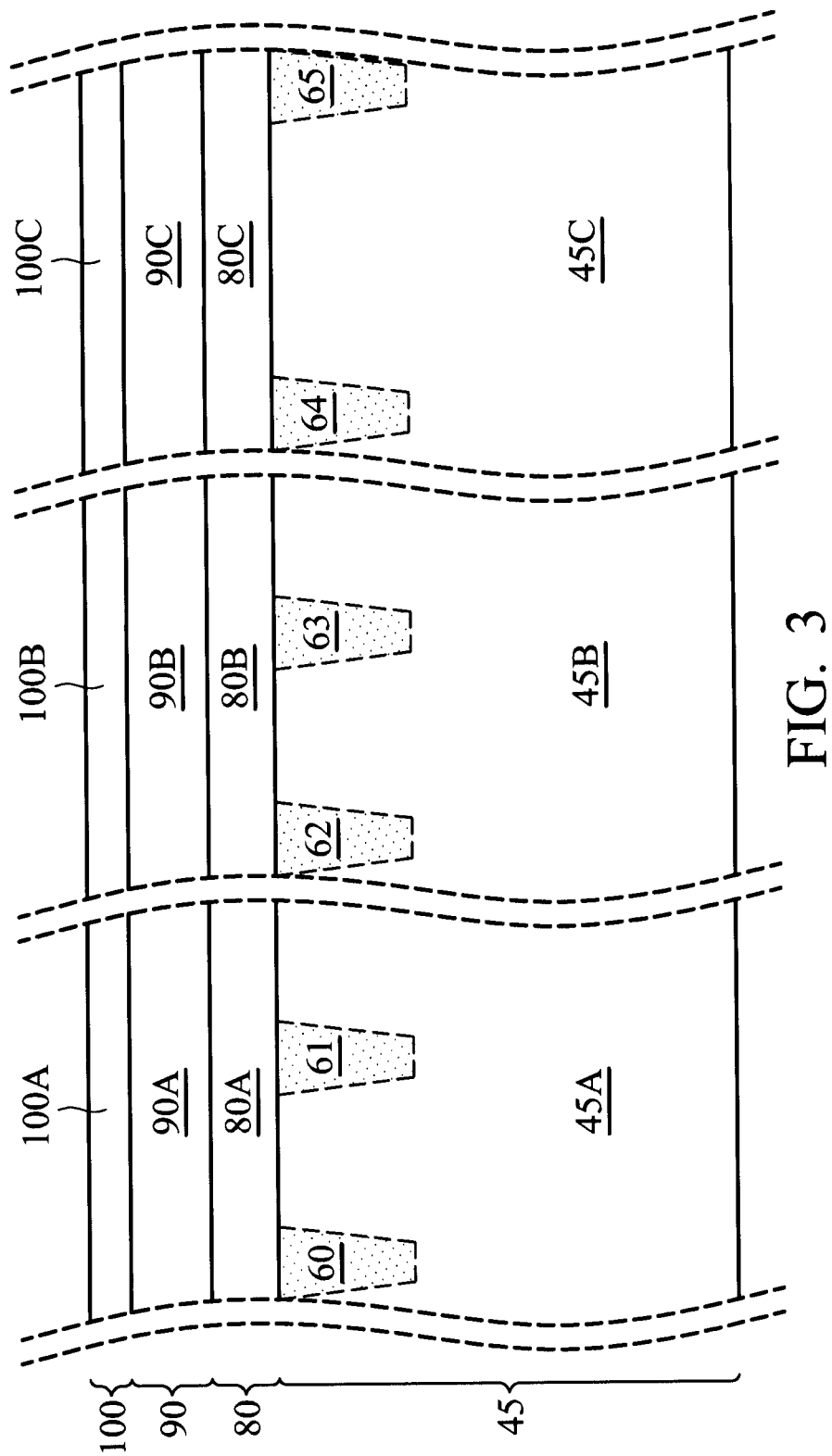

Referring now to FIG. 3, a polysilicon layer 80 is formed over the front surface 50 of the substrate 45. For ease of reference, portions of the polysilicon layer 80 formed over the substrate portions 45A, 45B, 45C are referred to as polysilicon layer portions 80A, 80B, and 80C, respectively. The polysilicon layer 80 may be formed using a deposition process known in the art, such as a chemical vapor deposition (CVD) process, a physical vapor deposition (PVD) process, an atomic layer deposition (ALD) process, or combinations thereof. The polysilicon layer 80 may have a thickness in a range from about 2000 Angstroms to about 3000 Angstroms.

Thereafter, a hard mask layer 90 is formed over the polysilicon layer 80. Similar to the polysilicon layer 80, the hard mask layer 90 includes portions 90A, 90B, and 90C. The hard mask layer 90 may be formed by a deposition process known in the art, such as CVD, PVD, ALD, or combinations thereof. The polysilicon layer 80 may have a thickness in a range from about 1000 Angstroms to about 1500 Angstroms.

Thereafter, an amorphous silicon layer 100 is formed over the hard mask layer 90. Similar to the polysilicon layer 80, the amorphous silicon layer 100 includes portions 100A, 100B, and 100C. The amorphous silicon layer 100 may be formed by a deposition process known in the art, such as CVD, PVD, ALD, or combinations thereof. The amorphous silicon layer 100 may have a thickness in a range from about 100 Angstroms to about 500 Angstroms.

Figure 4:
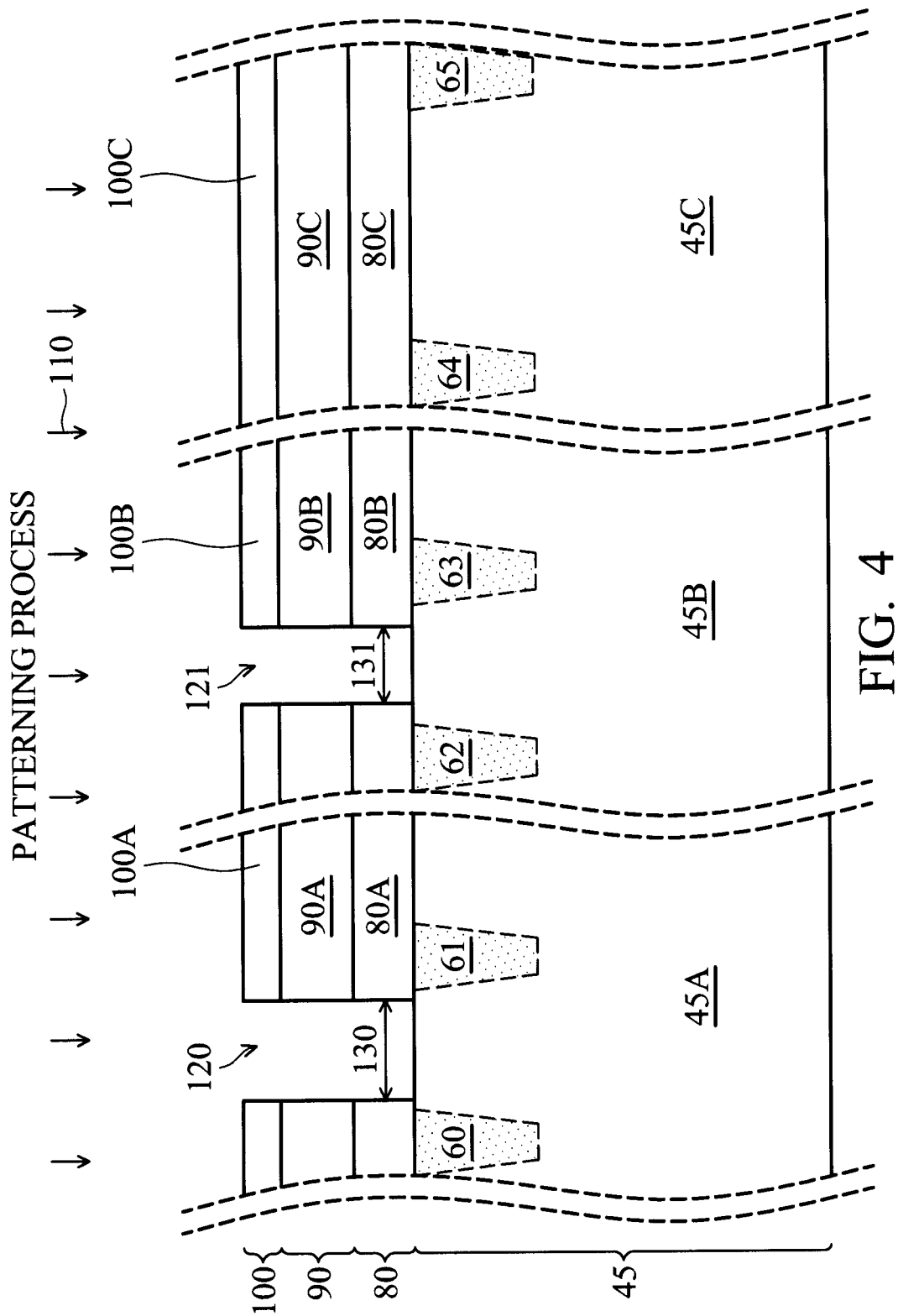

Referring now to FIG. 4, a patterning process 110 is performed on the layers 80-100 to form openings 120 and 121 in the layers 80A-100A and 80B-100B, respectively. The patterning process 110 may include a photolithography process to pattern a photoresist material (not illustrated) to form openings therein, and using the patterned photoresist material to form the openings 120-121. The photolithography process may include various exposure, developing, baking, stripping, and etching processes. Portion of the thermal oxide layers (not illustrated) between the isolation structures 60-61 and 62-63 are also removed by the patterning process 110, such that the openings 120-121 each expose a silicon surface of the substrate portions 45A and 45B, respectively.

The patterning process 110 is carried out in a manner such that the openings 120 and 121 have widths (or lateral/horizontal dimensions) 130 and 131, respectively. The opening 120 is formed to be wider than the opening 121. In an embodiment, the opening 120 is at least twice as wide as the opening 121. In another embodiment, a ratio of the openings 120 and 121 is in a range from about 7:3 to 5:2.

Figure 5:
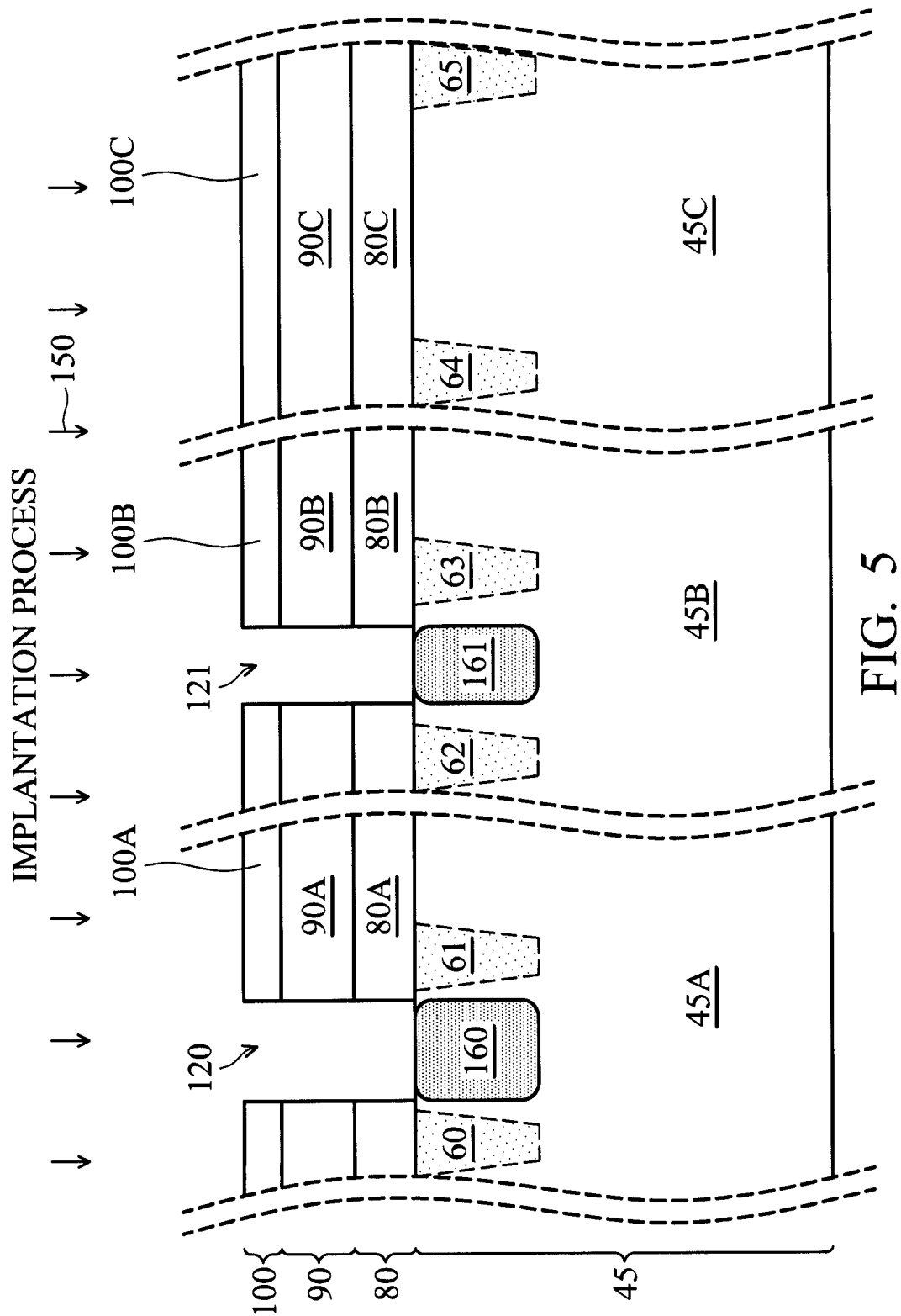

Referring now to FIG. 5, an implantation process 150 is performed to the substrate 45 to form doped regions 160 and 161 in the substrate portions 45A and 45B, respectively. The layers 80-100 serve as protective masks during the implantation process 150, while a dopant is implanted to the substrate portions 45A and 45B through the openings 120-121, respectively. In an embodiment, the dopant is an N-type dopant. In alternative embodiments, the dopant may be a P-type dopant. The doped regions 160-161 may also be referred to as doped wells (N-wells here). The position or location of the doped regions 160-161 may be adjusted by tuning an implantation energy level of the implantation process 150. For example, a higher implantation energy level results in a deeper implant, which means the doped regions 160-161 extend deeper into the substrate 45, and vice versa.

Figure 6:
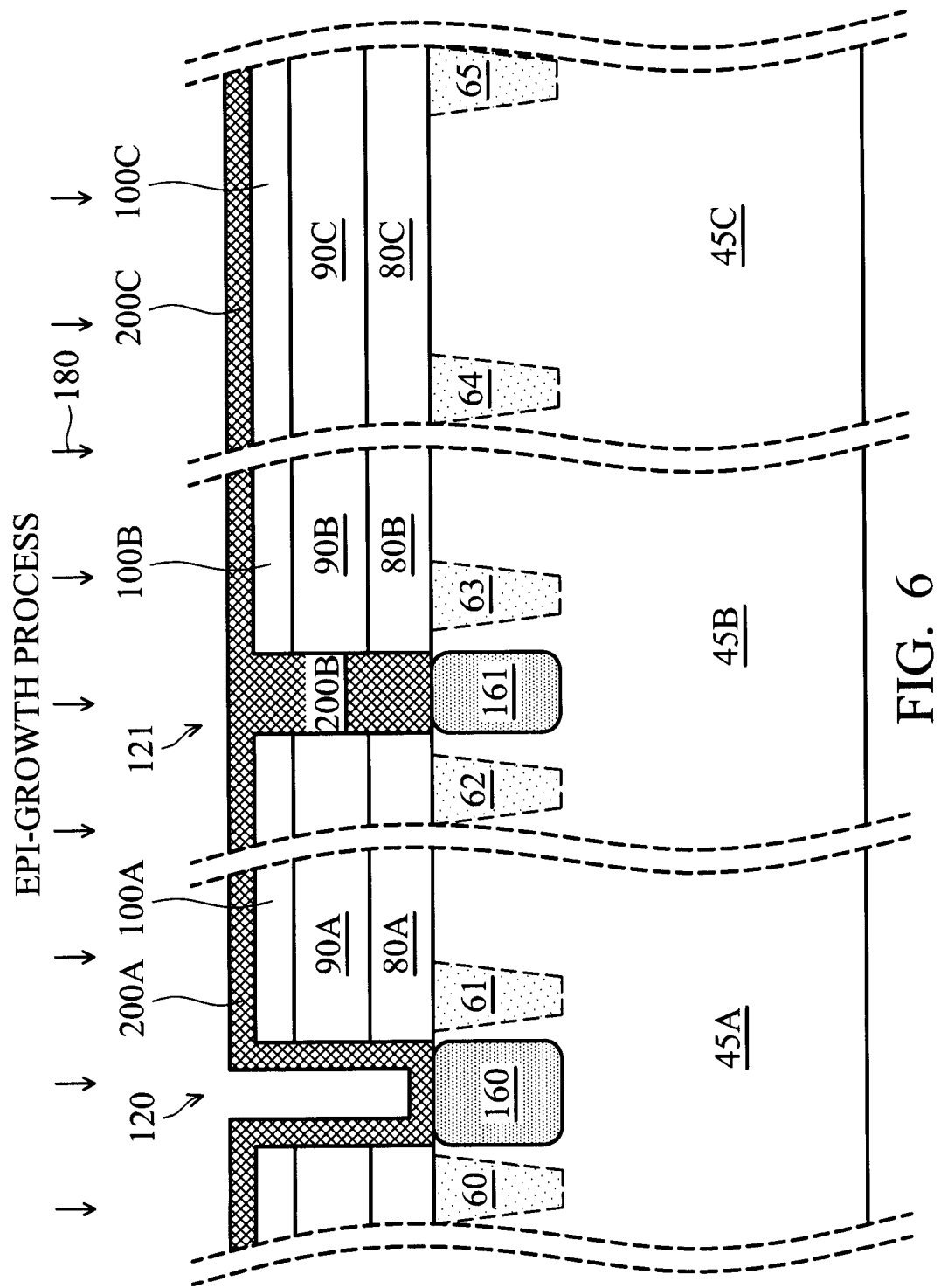

Referring now to FIG. 6, an epitaxial-growth process 180 is performed to form a material layer 200 over exposed surfaces of the layers 80-100 and the doped regions 160-161. The material layer 200 includes silicon germanium in the present embodiment, but may include other suitable materials in alternative embodiments. The material layer 200 can be epi-grown to take on a doping polarity (including one of N and P dopants), or be implanted to take on a doping polarity. The doping polarity of the material layer is opposite from that of the doped regions 160-161. For example, in an embodiment where the doped regions 160-161 are N-type, the material layer 200 is P-type.

The material layer 200 includes portions 200A, 200B, and 200C. In the embodiment illustrated in FIG. 6, the material layer 200 includes silicon germanium. Silicon germanium can be epi-grown very fast on a polysilicon material, and relatively fast on an amorphous silicon material. As such, the silicon germanium material of the portions 200A-200B on the side walls of the polysilicon layer portions 80A-B and the amorphous silicon layer portions 100A-100B are grown laterally. Meanwhile, the silicon germanium material of the portions 200A-200B on the surface of the doped regions 160-161 (which have exposed silicon surfaces) are grown upwards.

As discussed above in association with FIG. 4, the opening 121 is substantially narrower than the opening 120. The smaller width of the opening 121, in combination with the fast epi-growth characteristic of the silicon germanium on polysilicon, result in the portion 200B of the material layer substantially filling the opening 121. Since the opening 120 is wider, it is left unfilled so that other elements may still be formed in the opening 120, as will be discussed below.

Figure 7:
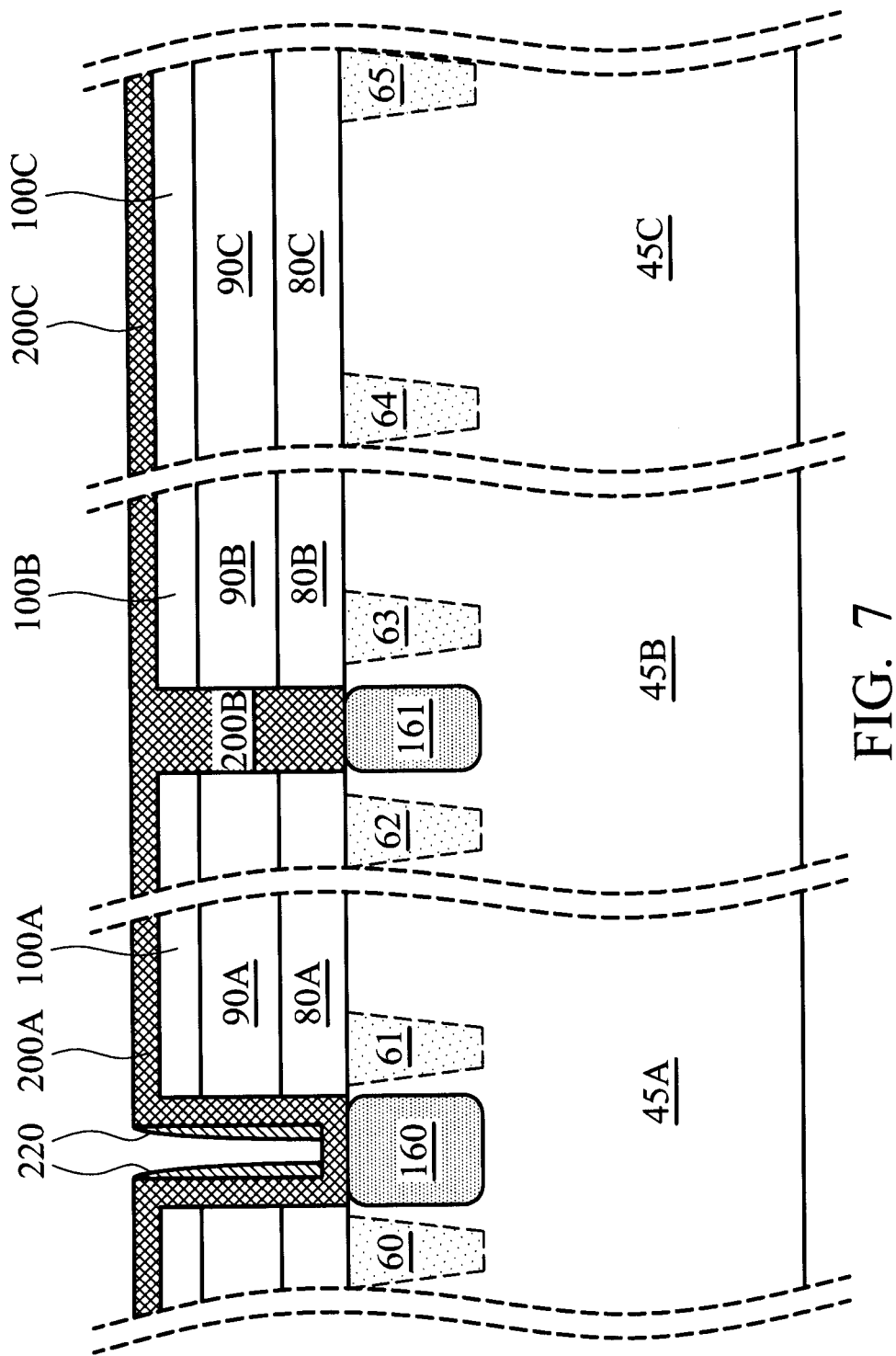

Referring now to FIG. 7, insulating elements 220 are formed on the side walls of the portion 200A of the material layer. The insulating elements 220 may be formed by performing various suitable deposition processes and isotropic etching processes known in the art. In an embodiment, the insulating elements 220 include an oxide-nitride-oxide (ONO) structure, meaning a nitride layer is sandwiched by two oxide layers. The nitride layer may include silicon nitride, and the oxide layers may include Tetra Ethyl Oxysilane (TEOS) oxide.

Figure 8:
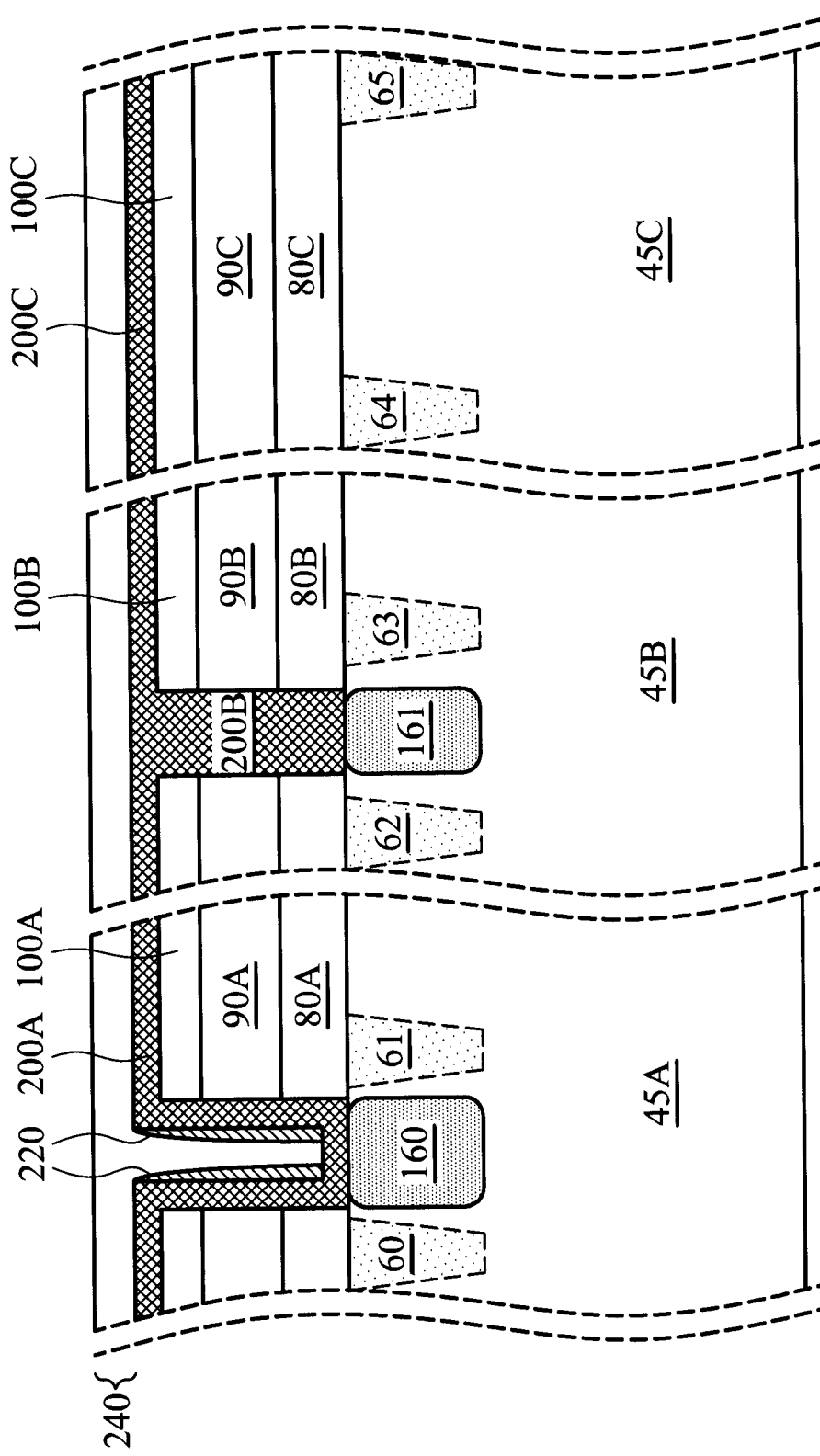

Referring now to FIG. 8, a doped layer 240 is formed over the portions 200A-200C of the material layer. The doped layer 240 may include a doped polysilicon material. The doped layer 240 has a doping polarity that is opposite from the doping polarity of the portions 200A-200B of the material layer. Thus, in an embodiment where the portions 200A-200B are P-type, the doped layer 240 is N-type. For example, the doped layer 240 may be doped with arsenic ions.

Figure 9:
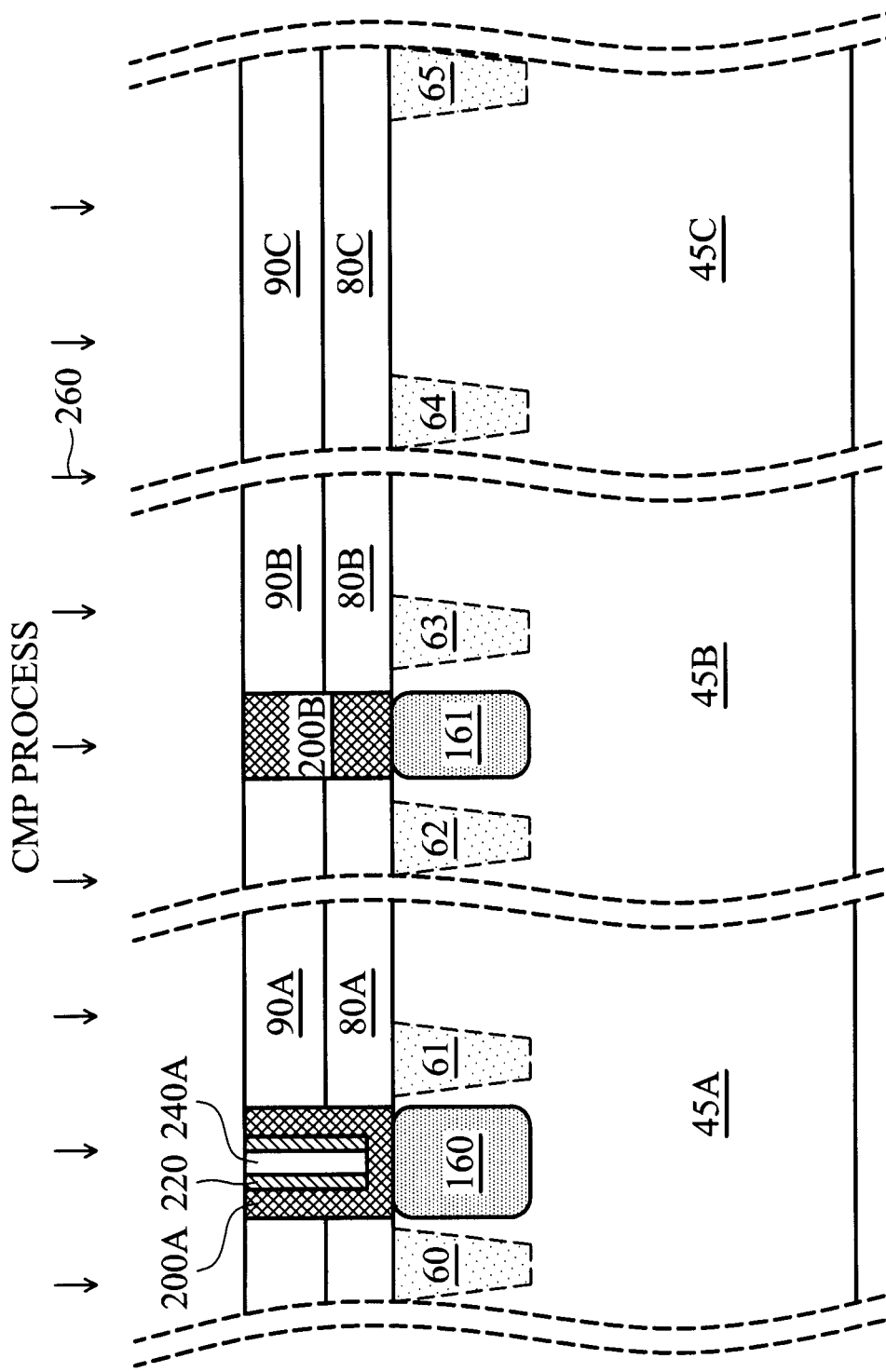

Referring now to FIG. 9, a chemical-mechanical-polishing (CMP) process 260 is performed to remove materials above the hard mask layer 90 and to form a smooth and planarized surface. The hard mask layer 90 serves as an etching-stop layer during the CMP process 260. After the CMP process 260 is performed, a portion of the doped layer 240A remains inside the opening 120 (shown in FIG. 6) and between the insulating elements 220. This portion of the doped layer 240A may also be referred to as a doped element 240A. The side walls of the doped element 240A are isolated or separated from the side walls of the portion 200A of the material layer by the insulating elements 220.

In addition, one or more annealing processes may be optionally performed to cause the portion 200B to completely fill the opening 121 (shown in FIG. 6). The portion 200B may also be referred to as a doped component.

Figure 10:
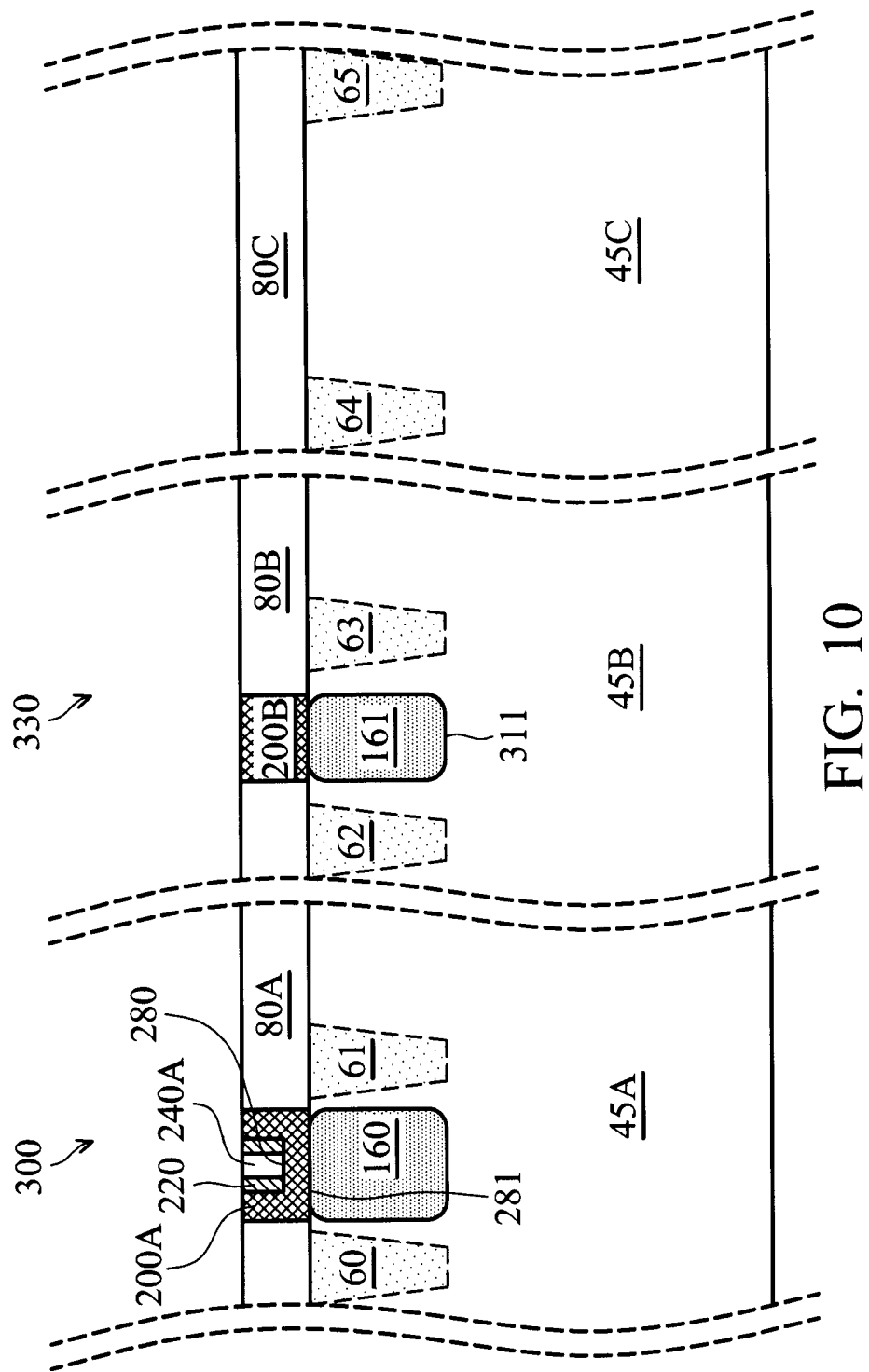
Figure 11:
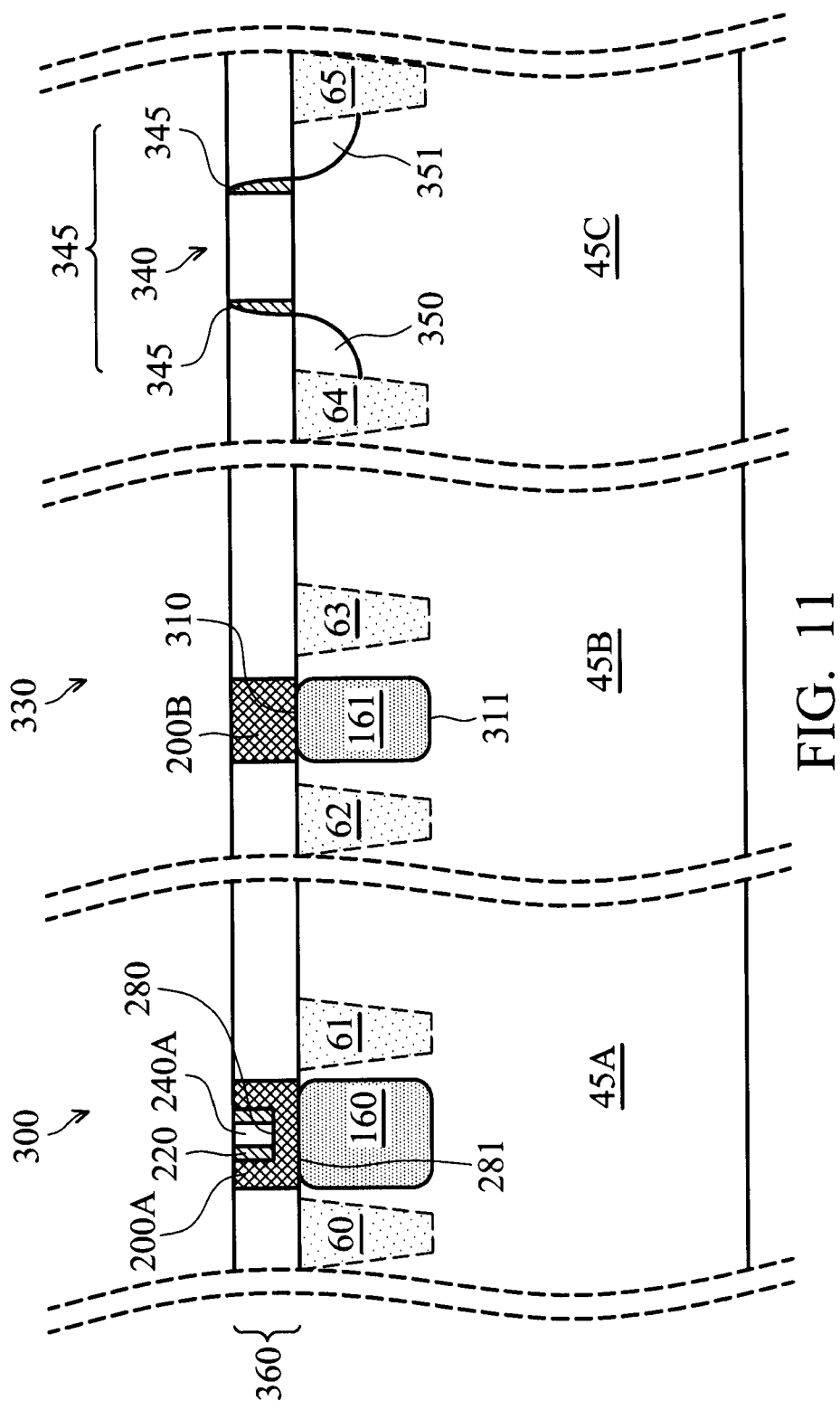

Referring now to FIG. 10, the hard mask layer 90 is removed, along with portions of the layers 200, 220, and 240 above the polysilicon layer 80. At this stage of fabrication, a P/N junction 280 is formed between the doped element 240A and the portion 200A of the material layer 200A therebelow.

Another P/N junction 281 is formed between the portion 200A and the doped region 160. In an embodiment, the doped element 240A is N-type, the portion 200A is P-type, and the doped region 160 is N-type. As such, an NPN-type transistor 300 is formed by the doped element 240A—serving as the emitter (or emitter region), the portion 200A—serving as the base (or base region), and the doped region 160—serving as the collector (or collector region). The insulating elements 220 electrically isolate portions of the emitter (the doped element 240A) from portions of the base (the portion 200A).

Meanwhile, a P/N junction 310 is formed between the portion 200B of the material layer and the doped region 161 therebelow. Another P/N junction 311 is formed between the doped region 161 and the substrate portion 45B surrounding it. In an embodiment, the portion 200B is P-type, the doped region 161 is N-type, and the substrate portion 45B is P-type. As such, a PNP-type transistor 330 is formed by the portion 200B—serving as the emitter, the doped region 161—serving as the base, and the substrate portion 45B—serving as the collector. In an alternative embodiment, a P-type doped well (also referred to as P-well, not illustrated) may be formed in the substrate portion 45B to at least partially surround the doped region 161. As such, a P/N junction may be formed between this P-well and the doped region 161, and thus the PNP-type transistor 330 would include the portion 200B (emitter), the doped region 161 (base), and the P-well (collector).

Although the transistor 300 is an NPN transistor and the transistor 330 is a PNP transistor in the present embodiment, it is understood that in alternative embodiments, the transistor 300 may be a PNP transistor, and the transistor 330 may be an NPN transistor. This may be accomplished by switching the doping polarities of each of the emitter, base, and collector regions for both the transistors 300 and 330.

Additional processes may be performed to continue the fabrication process described herein. For example, referring to FIG. 11, a FET device may be formed in the substrate portion 45C. The FET device 335 may include a gate having a gate dielectric layer and a gate electrode layer. The gate electrode layer may be formed by patterning the polysilicon layer portion 80C (shown in FIGS. 3-10). Gate spacers 345 may also be formed on the sidewalls of the gate 340. The gate spacers 345 may include the same material composition as the insulating elements 220 and may be formed by similar processes. For example, like the insulating elements 220, the gate spacers 345 may also include an oxide-nitride-oxide structure. In addition, one or more implantation processes may be performed to form source/drain regions 350-351. Each of the source/drain regions 350-351 may include a lightly doped region and a heavily doped region.

In an embodiment, the polysilicon layer portions 80A and 80B (shown in FIGS. 3-10) may also be removed and be replaced with a dielectric layer 360, which may also be formed to surround the gate 340. Also, although not illustrated for the sake of simplicity, electrical contacts may be formed to couple to the emitter, base, and collector regions, respectively, of the NPN transistor 300 and the PNP transistor 330, so that electrical connections between the transistors 300 and 330 may be established with external devices. Further additional fabrication processes may include the formation of an interconnect structure, passivation of layers, slicing of wafers, and/or packaging of devices.

The embodiments disclosed herein offer several advantages. One of the advantages is that, as discussed above, an NPN-type bipolar transistor can be formed with a PNP-type bipolar transistor at the same time. Traditionally, one or more extra masks are needed to define the PNP-type bipolar transistor separately from the NPN-type bipolar transistor. These extra masks entail extra fabrication processes and thus increase fabrication costs and lengthen production time. In comparison, the embodiments disclosed herein take advantage of the fast growth characteristic of silicon germanium on polysilicon surfaces to form the base for one bipolar transistor while also forming the emitter for the other bipolar transistor of opposite polarity (or opposite type). As such, no extra masks or fabrication processes are needed to form the PNP-type bipolar transistor, as it can be formed using substantially the same processes that form the NPN-type bipolar transistor.

Another advantage is that the fabrication processes to form the bipolar transistors here are compatible with traditional FET processes, such as CMOS processes. For example, the FET processes typically involve forming a polysilicon layer. Here, the polysilicon layer is utilized to epi-grow the material that serves as the base for one transistor and the emitter for the other transistor of opposite polarity. It is understood, however, that other embodiments may offer different advantages, and that no particular advantage is required for all embodiments.

One of the broader forms of the present disclosure involves a semiconductor device that includes a first transistor and a second transistor that are formed on the same substrate. The first transistor includes a first collector, a first base, and a first emitter. The first collector includes a first doped well disposed in the substrate. The first base includes a first doped layer disposed above the substrate and over the first doped well. The first emitter includes a doped element disposed over a portion of the first doped layer. The second transistor includes a second collector, a second base, and a second emitter. The second collector includes a doped portion of the substrate. The second base includes a second doped well disposed in the substrate and over the doped portion of the substrate. The second emitter includes a second doped layer disposed above the substrate and over the second doped well. Wherein one of the first and second transistors is an NPN-type transistor, and the other one is a PNP-type transistor.

Another of the broader forms of the present disclosure involves a semiconductor device. The semiconductor device includes a substrate that includes an interface and first and second isolation structures formed below the interface. The semiconductor device includes a bipolar transistor. The bipolar transistor includes a collector that includes a first doped portion of the substrate, the first doped portion being formed below the interface. The bipolar transistor includes a base that includes a second doped portion of the substrate, the second doped portion being formed below the interface between the first and second isolation structures and being at least partially surrounded by the first doped portion. The bipolar transistor includes an emitter that includes a doped component formed above the interface and between the first and second isolation structures. The second doped portion has a doping polarity opposite from doping polarities of the first doped portion and the doped component. The first and second doped portions form a first P/N junction. The second doped portion and the doped element form a second P/N junction.

Still another of the broader forms of the present disclosure involves a method of fabricating a semiconductor device. The method includes providing a substrate having first, second, third, and fourth isolation structures. The method includes forming a polysilicon layer over the substrate. The method includes forming first and second openings in the polysilicon layer, the first opening exposing a first region of the substrate that is between the first and second isolation structures, the second opening exposing a second region of the substrate that is between the third and fourth isolation structures, wherein the first opening is wider than the second opening. The method includes performing an implantation process to the substrate through the first and second openings to form a first doped region in the first region of the substrate and a second doped region in the second region of the substrate. The method includes epi-growing a material layer over the substrate, a first portion of the material layer being epi-grown in the first opening and forming a first P/N junction with the first doped region, a second portion of the material layer being epi-grown in the second opening and forming a second P/N junction with the second doped region. Wherein the epi-growing is carried out in a manner so that the second portion of the material layer substantially fills the second opening.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
a substrate;
a first transistor that includes a first collector, a first base, and a first emitter, wherein the first collector includes a first doped well disposed in the substrate, the first base includes a first doped layer disposed above the substrate and over the first doped well, and the first emitter includes a doped element disposed over a portion of the first doped layer, wherein the first transistor is formed in a material layer; and
a second transistor that includes a second collector, a second base, and a second emitter, wherein the second collector includes a doped portion of the substrate, the second base includes a second doped well disposed in the substrate and over the doped portion of the substrate, and the second emitter includes a second doped layer disposed above the substrate and over the second doped well, wherein the second transistor is formed in the material layer; and
a Field-Effect-Transistor (FET) device having a portion thereof formed in the substrate,
wherein the material layer has a polysilicon portion that serves as a gate electrode of the FET device,
wherein one of the first and second transistors is an NPN-type transistor, and the other one is a PNP-type transistor.

2. The semiconductor device of claim 1, wherein the material layer has first and second openings,
wherein the first opening contains the first doped layer, the doped element, and an insulating layer that separates the doped element from portions of the first doped layer; and
wherein the second opening contains the second doped layer.

3. The semiconductor device of claim 2, wherein the first and second openings include first and second lateral dimensions, respectively, and wherein the first lateral dimension is greater than the second lateral dimension.

4. The semiconductor device of claim 3, wherein:
the second opening is substantially filled with the second doped layer; and
a ratio of the first lateral dimension and the second lateral dimension exceeds at least 2:1.

5. The semiconductor device of claim 1, wherein the FET device includes a gate spacer, the gate spacer and the insulating layer including a same material.

6. The semiconductor device of claim 1, wherein the first base defines a trench with the first emitter and an insulative material being disposed within the trench, the insulative material within the trench separating a portion of the first emitter from a portion of the base.

7. The semiconductor device of claim 1, wherein a top surface of the first emitter is substantially coplanar with a top surface of the second base, and
wherein the top surface of the first emitter is positioned further away from a top surface of the substrate than any other surface of the first emitter and wherein the top surface of the second base is positioned further away from the top surface of the substrate than any other surface of the second base.

8. A semiconductor device, comprising:
a substrate that includes an interface and first and second isolation structures formed below the interface; and
a bipolar transistor that includes:
a collector that includes a first doped portion of the substrate, the first doped portion being formed below the interface;
a base that includes a second doped portion, the second doped portion being formed above the interface between the first and second isolation structures, the second doped portion defining a trench that includes a bottom surface and sidewall surfaces intersecting the bottom surface, wherein the second doped portion includes a top surface that is positioned further away from the interface than any other surface of the second doped portion;
an emitter that includes a doped component formed above the interface and between the first and second isolation structures, wherein the doped component includes a top surface that is positioned further away from the interface than any other surface of the doped component; and
an insulative material disposed on the sidewall surfaces of the trench, the insulative material separating the doped component of the emitter from the second doped portion of the base;
wherein:
the top surface of the second doped portion is substantially coplanar with the top surface of the doped component;
the second doped portion has a doping polarity opposite from doping polarities of the first doped portion and the doped component;
the first and second doped portions form a first P/N junction; and
the second doped portion and the doped element form a second P/N junction.

9. The semiconductor device of claim 8, wherein the substrate includes third and fourth isolation structures formed below the interface, and further including a further bipolar transistor that includes:
a further collector that includes a third doped portion of the substrate formed below the interface and between the third and fourth isolation structures, the third and second doped portions having the same doping polarity;
a further base that includes a first doped layer formed below the interface and between the third and fourth isolation structures; and a further emitter that includes a second doped layer formed above the interface, the second doped layer and the second doped portion having the same material composition and doping polarity; and wherein:

the third doped portion and the first doped layer form a third P/N junction;

the first and second doped layers form a fourth P/N junction; and one of the bipolar transistor and further bipolar transistor is an NPN-type bipolar transistor, and the other one is a PNP-type bipolar transistor.

10. The semiconductor device of claim 9, wherein:

the second doped layer and the doped component both include silicon germanium; and the first, second, third and fourth isolation structures each include a shallow-trench isolation (STI) device having a dielectric material.

11. The semiconductor device of claim 9, wherein:

the interface extends in a horizontal direction;

the second doped layer has a first dimension measured in the horizontal direction;

the doped component has a second dimension measured in the horizontal direction; and a ratio between the second and first dimensions is in a range from about 7:3 to about 5:2.

12. The semiconductor device of claim 8, further including a Field-Effect-Transistor (FET) device having a source, a drain, and a gate;

wherein:

the source and drain are formed in the substrate below the interface; and the gate is formed above the interface and includes a polysilicon material.

* * * * *